United States Patent
Abdul-Hak et al.

(10) Patent No.: US 6,368,970 B1
(45) Date of Patent: Apr. 9, 2002

(54) SEMICONDUCTOR CONFIGURATION AND CORRESPONDING PRODUCTION PROCESS

(75) Inventors: Ayad Abdul-Hak, Dresden; Achim Gratz, Steinbach-Hallenberg; Christoph Ludwig, Langebrück; Reinhold Rennekamp, Dresden; Elard Stein Von Kamienski, Dresden; Peter Wawer, Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/645,238

(22) Filed: Aug. 24, 2000

(51) Int. Cl.[7] .............................................. H01L 21/302
(52) U.S. Cl. .................... 438/690; 438/133; 438/299; 438/306; 438/397; 438/734; 257/371; 257/538
(58) Field of Search .................. 438/690, 397, 438/299, 306, 734, 133; 257/371, 538

(56) References Cited

U.S. PATENT DOCUMENTS

| | | | |
|---|---|---|---|
| 5,187,559 A | * 2/1993 | Isobe et al. | 257/538 |
| 5,712,185 A | 1/1998 | Tsai et al. | 438/424 |
| 5,863,827 A | 1/1999 | Joyner | 438/425 |
| 5,962,901 A | * 10/1999 | Kerber | 257/371 |
| 5,989,972 A | * 11/1999 | Widmann et al. | 438/397 |
| 6,010,948 A | 1/2000 | Yu et al. | 438/436 |
| 6,013,937 A | 1/2000 | Beintner et al. | 257/513 |
| 6,020,621 A | 2/2000 | Wu | 257/506 |
| 6,057,199 A | * 5/2000 | Stecher et al. | 438/299 |

OTHER PUBLICATIONS

"Unterdrückung des Corner–Effektes an einer STI–Kante durch lokale Kontrolle der Ätzrate" (Gratz et al.), dated Jan. 2000, Siemens Technik Report, Jahrgang 3, Nr. 6, pertains to the suppression of the Corner–Effect on an STI–edge by the local control of the etch ratio.

* cited by examiner

Primary Examiner—Richard Elms
Assistant Examiner—Pho Luu
(74) Attorney, Agent, or Firm—Herbert L. Lerner; Laurence A. Greenberg; Werner H. Stemer

(57) ABSTRACT

A process for producing a semiconductor configuration includes the steps of providing a semiconductor substrate, providing a buffer oxide layer on the semiconductor substrate and providing a hard mask on the buffer oxide layer. An STI trench is etched by using the hard mask and a liner oxide layer is provided in the STI trench. The hard mask is removed to expose the buffer oxide layer and the buffer oxide layer is removed by an etching process. The buffer oxide layer is etched more rapidly than the liner oxide layer in the etching process. A gate oxide layer is provided on the semiconductor substrate. A semiconductor configuration is also provided.

11 Claims, 2 Drawing Sheets

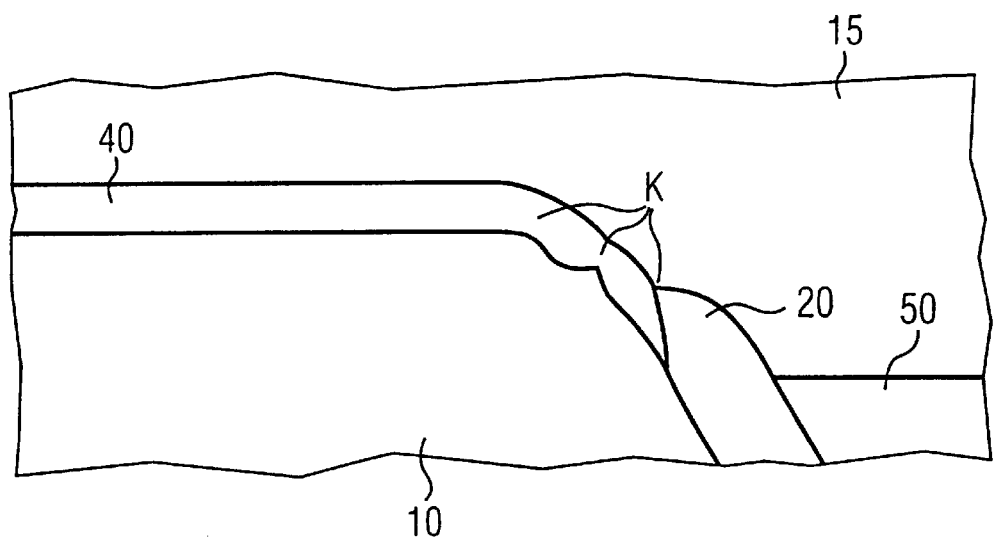

SEMICONDUCTOR CONFIGURATION AND CORRESPONDING PRODUCTION PROCESS

BACKGROUND OF THE INVENTION

Field of the Invention

The present invention relates to a semiconductor configuration and a corresponding production process.

The present invention and the problem on which it is based will be explained in relation to MOS transistors, although in principle it can be used on any desired semiconductor configuration of that type.

MOS transistors are basic components of modern semiconductor memories, such as read/write memories (RAM) or read-only memories (ROM). With increasing integration of memories, MOS transistors of that type must be fabricated with channel widths that become smaller and smaller, which entails a steadily increasing requirement on isolation between the individual MOS transistors.

The use of STI technology (STI=Shallow Trench Isolation) has proven to be advantageous in order to meet those increased requirements on the isolation. In that technology, isolation trenches are formed between the MOS transistors in the semiconductor substrate through the use of etching and are subsequently filled with an insulating material, for example silicon dioxide.

A conventional production of an MOS transistor having an STI isolation trench is explained in greater detail below with reference to FIG. 2. FIG. 3 shows the known MOS transistor following removal of a hard mask and buffer oxide layer and application of a gate oxide layer, but before application of a gate material. An insulating filler material and a liner oxide layer are thinned considerably during the removal of the buffer oxide layer. That leads to the formation of so-called critical points at edges of the STI trenches. As a result, a parasitic MOS transistor or a corner or edge effect is produced which primarily has the effect of impairing a sub-threshold characteristic curve. In addition, thinning of the oxide can occur at the edge of the STI trenches, as a result of a non-planar structure, which results in reinforcement of the corner effect, a reduction in reliability and increased gate leakage currents.

Known solutions for reducing that problem provide for the edge of the STI trenches to be rounded through the use of suitable processing in order to reduce the oxide thinning. However, at the same time the extent to which the polysilicon for the gate connection wraps-around the edge of the STI trenches is increased. Another option is provided by the so-called raised STI, but because of a necessary twofold polysilicon deposition, that necessitates a higher process complexity and requires completely different process integration. The aforementioned wrap-around also leads to the control of the gate width becoming more difficult.

SUMMARY OF THE INVENTION

It is accordingly an object of the invention to provide a semiconductor configuration and a corresponding production process, which overcome the hereinafore-mentioned disadvantages of the heretofore-known devices and methods of this general type in such a way that a disruptive corner effect or edge effect can be controlled better.

With the foregoing and other objects in view there is provided, in accordance with the invention, a process for producing a semiconductor configuration, which comprises providing a semiconductor substrate; providing a buffer oxide layer on the semiconductor substrate; providing a hard mask on the buffer oxide layer; etching an STI trench by using the hard mask; providing a liner oxide layer in the STI trench; removing the hard mask to expose the buffer oxide layer; removing the buffer oxide layer in an etching process and etching the buffer oxide layer more rapidly than the liner oxide layer in the etching process; and providing a gate oxide layer on the semiconductor substrate.

The concept on which the present invention is based is to prevent the thinning of the liner oxide at the edge of the STI trenches through the use of local control of the etching rate of the buffer oxide layer and/or a local change in the material properties during back-etching. This is done so that the wrap-around of the polysilicon for the gate connection around the edge of the STI trench, which is typical of rounded edges, does not occur. In the production process according to the invention, exposing the edge of the STI trenches is avoided. At the same time, overetching of the STI filling can be reduced considerably in comparison with a conventional process, through the use of better control of the etching rate.

In comparison with the approaches of the known solution, the production process according to the invention has, inter alia, the following advantages. The etching selectivity which is obtained thereby permits the avoidance of exposing the edge of the STI trenches during the definition of the active regions.

Although, in principle, specific rounding of the edge of the STI trenches is rendered superfluous by specific process management, it can continue to be used separately, for example to reduce mechanical stresses. A further advantage in the production process according to the invention is therefore that mechanical stresses and the corner effect can be optimized separately from each other.

In accordance with another mode of the invention, before the etching process, the trench is filled with an insulating material, and the buffer oxide layer is etched more rapidly in the etching process than the insulating material.

In accordance with a further mode of the invention, the hard mask is produced from nitride.

In accordance with an added mode of the invention, the liner oxide layer is produced as thermal oxide.

In accordance with an additional mode of the invention, the buffer oxide layer is produced as deposited oxide, in particular TEOS oxide. Such a deposited oxide has a higher etching rate than a thermal oxide.

In accordance with yet another mode of the invention, the buffer oxide layer is produced as doped oxide. Such a doped oxide likewise has a higher etching rate than a thermal oxide. However, the buffer layer only needs to have a certain minimum selectivity in order to fill the isolation trench, that is to say it does not necessarily have to be an oxide.

In accordance with yet a further mode of the invention, etching is carried out to remove the natural oxide before the liner oxide layer is provided.

In accordance with yet an added mode of the invention, a gate terminal is provided on the gate oxide layer.

With the objects of the invention in view, there is also provided, a semiconductor configuration for an MOS transistor configuration, in particular a semiconductor memory cell configuration, comprising a semiconductor substrate; an STI trench etched in the semiconductor substrate; a liner oxide layer disposed in the STI trench; and a gate oxide layer disposed on the semiconductor substrate.

Other features which are considered as characteristic for the invention are set forth in the appended claims.

Although the invention is illustrated and described herein as embodied in a semiconductor configuration and a corresponding production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a view similar to FIGS. 1 and 2 showing the state of a known MOS transistor following removal of a hard mask and buffer oxide layer and an application of a gate oxide layer, and before application of gate material.

DESCRIPTION OF THE PREFERRED EMBODIMENTS

Figure 2:
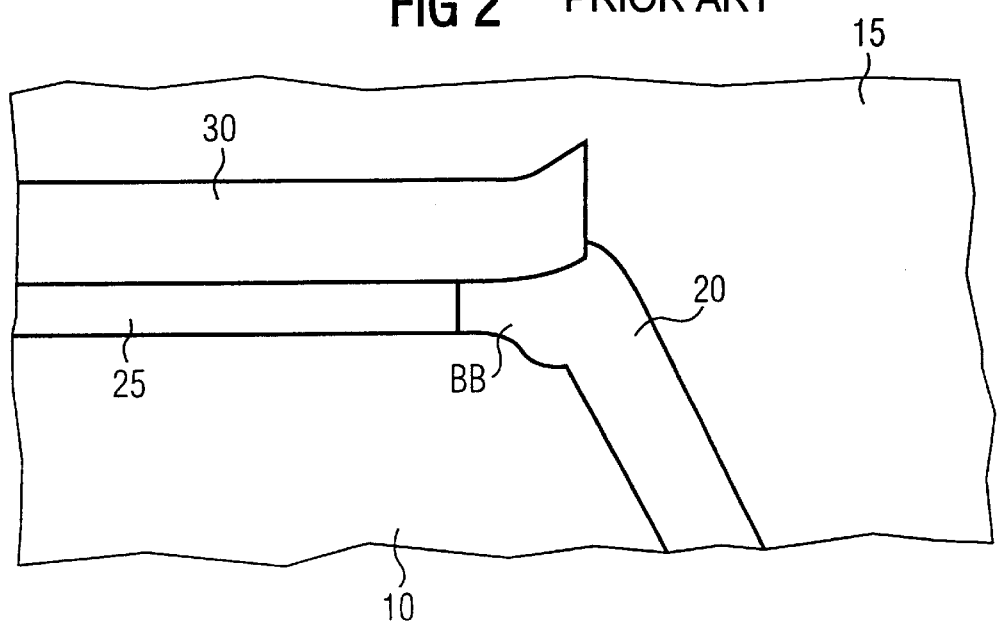
FIG. 2 is a view similar to FIG. 1 showing an example of conventional production stages of an MOS transistor having an STI isolation trench.

Referring now in detail to the figures of the drawings, in which identical reference symbols designate identical or functionally identical components, and first, particularly, to FIG. 2 thereof, there is seen an example of a conventional production of an MOS transistor having an STI isolation trench.

In FIG. 2, reference numeral 10 designates a silicon semiconductor substrate. Initially, a buffer oxide layer 25 is formed on the silicon semiconductor substrate 10 by thermal oxidation. Following this, a nitride hard mask 30 is deposited onto the buffer oxide layer 25 and structured by using a photoresist mask in order to form subsequent STI trenches 15.

This is followed by etching the STI trenches 15 by using the nitride hard mask 30. During this etching, it is possible for a non-illustrated photoresist used for structuring the hard mask 30 to remain on the hard mask 30 or not. However, following the etching of the STI trenches 15, this resist must be removed in any case.

In a subsequent process step, brief HF overetching of the STI trenches 15 is carried out in order to remove natural oxide. This is followed by thermal oxidation to form a liner oxide layer 20 in the STI trenches 15. Due to the special features of the oxide formation on silicon, so-called bird beaks BB are formed on the edges of the STI trenches 15. In addition, in the edge area the nitride hard mask 30 is raised up, as can be seen in FIG. 2.

The STI trenches 15 are subsequently filled with an insulating filler material 50 seen in FIG. 3, which may likewise be oxide, for example.

FIG. 3 shows the state of the known MOS transistor following the removal of the hard mask 30 and buffer oxide layer 25 and an application of a gate oxide layer 40, but before an application of gate material.

As can be gathered from FIG. 3, the insulating filler material 50 and the liner oxide layer 20 are thinned considerably during the removal of the buffer oxide layer 25.

That leads to the formation of so-called critical points K at the edges of the STI trenches 15. As a result, a parasitic MOS transistor with a small cross section is produced at the edges of the STI trenches 15, during the deposition of a gate connection onto the gate oxide layer 40. Such a parasitic MOS transistor is also referred to as a corner effect or edge effect. That MOSFET generally has a low threshold voltage and, as a result of its low current-carrying capacity, primarily has the effect of impairing the sub-threshold characteristic curve. In addition, at the edge of the STI trenches 15, thinning of the oxide can occur as a result of the non-planar structure, which results in reinforcement of the corner effect,.a reduction in reliability and increased gate leakage currents.

Figure 1:
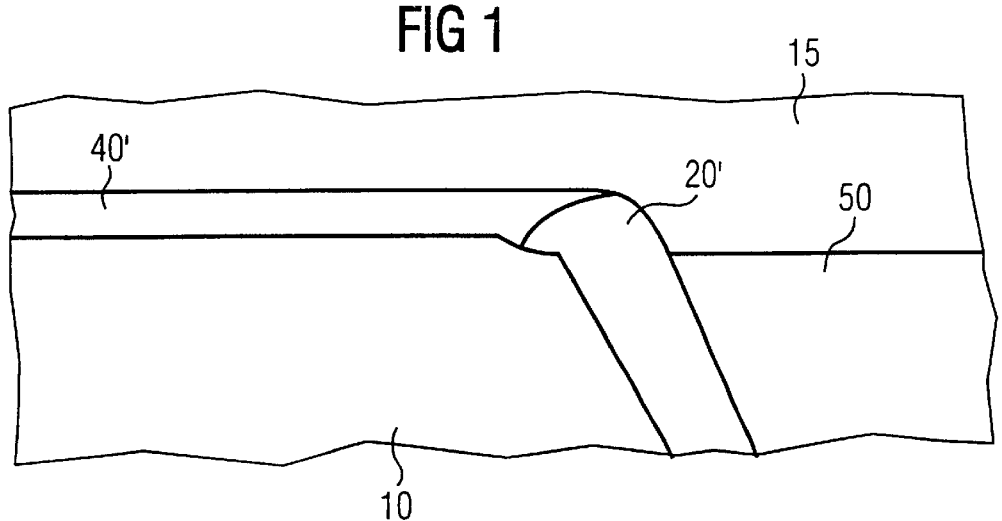
FIG. 1 is a fragmentary, diagrammatic, cross-sectional view of a semiconductor configuration as a first embodiment of the present invention.

FIG. 1 shows a diagrammatic representation of a semiconductor configuration as a first embodiment of the present invention.

The invention does not use the thermal buffer oxide 25 which is normally located under the nitride hard mask 30 for the etching of the STI trenches 15. Instead, in this embodiment, a deposited oxide, namely a TEOS oxide is used, having a higher etching rate during the etching step for the removal of the buffer oxide, with a liner oxide 20' and the filler material 50 exposed.

The etching-rate difference between the deposited buffer oxide and the liner oxide 20' formed thermally on the side wall of the STI trench permits a controlled residual oxide thickness of the liner oxide layer 20' to be left at the edge of the STI trenches 15 and on the side wall of the STI trenches 15, with simultaneous complete exposure of the active regions for the subsequent gate oxidation. Therefore, both excessively high oxide thinning of the liner oxide layer 20' and excessively high overetching of the STI filling 50 are advantageously avoided.

As is shown in FIG. 1, there are no longer any critical points in the area of the edge of the STI trenches 15. In addition, the insulating filler material 50 in the STI trenches 15 is attacked less severely, since the etching time can be reduced.

Although the present invention has been described above by using a preferred exemplary embodiment, it is not restricted thereto, but rather can be modified in many and various ways.

A TEOS oxide has been used as the buffer oxide layer in the above example, in order to ensure the etching-rate difference. However, according to a further preferred embodiment, the buffer oxide layer can be produced as a doped thermal oxide in order to effect the etching-rate difference.

We claim:

1. A process for producing a semiconductor configuration, which comprises the following steps:
    providing a semiconductor substrate;
    providing a buffer oxide layer on the semiconductor substrate;
    providing a hard mask on the buffer oxide layer;
    etching an STI trench by using the hard mask;
    providing a liner oxide layer in the STI trench;
    removing the hard mask to expose the buffer oxide layer;
    removing the buffer oxide layer in an etching process and etching the buffer oxide layer more rapidly than the liner oxide layer in the etching process, thereby leaving a controlled residual oxide thickness of the liner oxide layer at an edge of the STI trench; and
    providing a gate oxide layer on the semiconductor substrate.

2. The process according to claim 1, which further comprises filling the trench with an insulating material before the etching process, and etching the buffer oxide layer more rapidly than the insulating material in the etching process.

3. The process according to claim 1, which further comprises producing the hard mask from nitride.

4. The process according to claim 1, which further comprises producing the liner oxide layer as thermal oxide.

5. The process according to claim 1, which further comprises producing the buffer oxide layer as deposited oxide.

6. The process according to claim 1, which further comprises producing the buffer oxide layer as deposited TEOS oxide.

7. The process according to claim 1, which further comprises producing the buffer oxide layer as doped oxide.

8. The process according to claim 1, which further comprises removing natural oxide by etching before providing the liner oxide layer.

9. The process according to claim 1, which further comprises providing a gate terminal on the gate oxide layer.

10. A semiconductor configuration for an MOS transistor configuration, comprising:

a semiconductor substrate;

an STI trench etched in said semiconductor substrate;

a liner oxide layer disposed in said STI trench and said liner oxide layer having a controlled residual oxide thickness disposed at an edge of the STI trench; and a gate oxide layer disposed on said semiconductor substrate.

11. A semiconductor configuration for a semiconductor memory cell configuration, comprising:

a semiconductor substrate;

an STI trench etched in said semiconductor substrate;

a liner oxide layer disposed in said STI trench and said liner oxide layer having a controlled residual oxide thickness disposed at an edge of the STI trench; and a gate oxide layer disposed on said semiconductor substrate.

* * * * *